Figure 1:
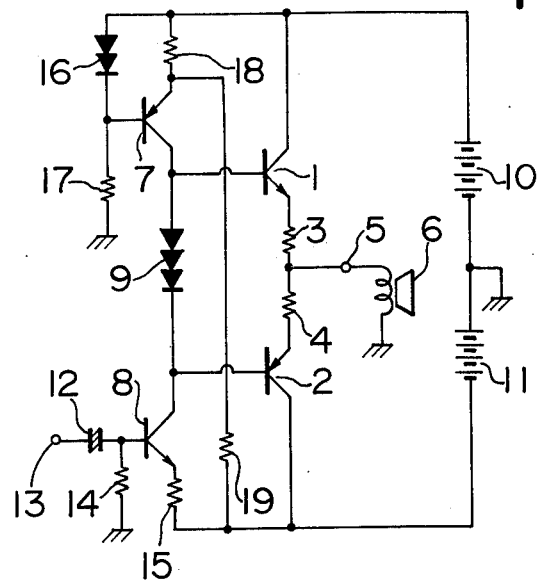

United States Patent [19]

Amada et al.

[11] 4,068,187
[45] Jan. 10, 1978

[54] AUDIO-FREQUENCY POWER AMPLIFIERS

[75] Inventors: Nobutaka Amada; Tohru Sampei; Akinori Maeda, all of Toyokawa, Japan

[73] Assignee: Hitachi, Ltd., Japan

[21] Appl. No.: 778,087

[22] Filed: Mar. 16, 1977

[30] Foreign Application Priority Data

Mar. 19, 1976 Japan .................................. 51-29244
Aug. 3, 1976 Japan .................................. 51-92014

[51] Int. Cl.$^2$ ............................................. H03F 3/26
[52] U.S. Cl. ..................................... 330/268; 330/255
[58] Field of Search ....................... 330/13, 15, 17, 18, 330/22

[56] References Cited

U.S. PATENT DOCUMENTS 3,376,388   4/1968   Reiffin ..................................... 330/13
3,883,813   5/1975   Sekiya ..................................... 330/13

*Primary Examiner*—Lawrence J. Dahl
*Attorney, Agent, or Firm*—Craig & Antonelli

[57] ABSTRACT

An audio- or low-frequency power amplifier comprises a pair of output transistors which are opposite in a conduction type to each other and connected in a complementary push-pull circuit configuration in which an impedance element is connected between the bases of the paired output transistors whose bases are adapted to be applied with an input signal while the output signal of the amplifier is derived from the coupled emitters of the output transistors. The amplifier further includes a current stabilizer transistor having a base-emitter junction across which a fixed bias voltage is applied and a collector, the current from which is supplied to the impedance element thereby to provide a bias voltage for the paired output transistors. A first resistor is connected between the emitter of the current stabilizer transistor and one electrode or pole of a first d.c. power source while a second resistor is connected between the emitter of the current stabilizer transistor and the other pole of the d.c. source, thereby to maintain constant the bias voltages applied to the paired output transistors.

8 Claims, 3 Drawing Figures

AUDIO-FREQUENCY POWER AMPLIFIERS

The present invention relates to an audio- or low-frequency power amplifier for amplifying the low-frequency signal and producing the output signal to be supplied to a load such as a loudspeaker and in more particular to an amplifier apparatus of a single-ended push-pull type for class B amplification.

For the audio-frequency power amplifier of radio receivers, playback apparatus for disk recording or the like, a push-pull amplifier circuit for the class B amplification is used at the output stage in order to have a large output power and at the same time to improve the power efficiency. In the push-pull amplifier circuit for the class B amplification, the operating points of transistors constituting the push-pull amplifier circuit are set in the region near the non-linear portion of the characteristic or performance curves of the respective transistors. Due to this fact, distortion which is referred to as crossover distortion will be likely to occur at the portion where the characteristic curves of both transistors intersect with each other. In an attempt to reduce such crossover distortion, it is known to arrange the output circuitry such that a small quantity of d.c. collector currents may flow through the output transistors connected for the class B amplification even when no input signal is present. Such collector currents should be maintained at a constant level or otherwise some trouble would occur. For example, when the collector current decreases, the crossover distortion will trend to increase. When the collector current increases on the other hand, there may arise the danger of the output transistors being destroyed. With a view to evading from such difficulty, it has been also hitherto known that a constant-current circuit is provided to supply a constant bias current to the output transistors connected in the push-pull configuration for the class B amplificaion thereby to stabilize the collector currents of the output transistors. The constant-current circuit of the conventional type is constructed in such a manner that a diode or a Zener diode is connected to a base or emitter circuitry of a current stabilizer transistor which has a base-emitter junction supplied with a bias voltage appearing across the diode or Zener diode, thereby to maintain the collector current of the current stabilizer transistor, which collector current is then utilized as the bias current for the output transistors.

However, the constant-current circuit of the above type is disadvantageous in that the output current thereof will vary upon the variation of the source voltage and therefore can not maintain constant the collector currents of the output transistors. In more detail, when the voltage of the d.c. power source varies for some reasons, the voltage drop across or at the diodes or Zener diode adapted for supplying a constant bias current to the current stabilizer transistor will undergo variation. Although the rate of variation in the voltage drop at the diode or Zener diode is small as compared with that of the variation in the source voltage, the bias voltage applied across the base and emitter of the current stabilizer transistor can not be evaded from variation due to that of the voltage drop at the diode. As a result, the collector current of the current stabilizer transistor will inevitably increase or decrease. In particular, in the case of a high rated output power amplifier destined to supply a high power to a load, it is noted that the source voltage will be subjected to remarkable variation in dependence on the types of output signals produced from the power amplifier. For example, when a signal having a wide dynamic range such as a musical signal is to be amplified, the source voltage will vary to a great degree, involving a high rate of variation in the voltage drop produced at the diode or Zener diode.

Furthermore, when the d.c. source voltage varies or, say, increases, collector losses at the output transistors as well as a driver transistor for driving them will be correspondingly increased, resulting in temperature rise in the junctions of these transistors. Such temperature rise will then cause the collector current of the output transistors to be increased. Inversely, when the d.c. source voltage is decreased or lowered, the collector currents of the output transistors will be also decreased, thereby to increase the crossover distortion.

Accordingly, an object of the invention is to provide an audio- or low-frequency power amplifier constructed to be less susceptible to the crossover distortion.

Another object of the invention is to provide a push-pull type low-frequency power amplifier in which d.c. collector currents of output transistors can be maintained constant.

A low- or audio-frequency lower amplifier according to one aspect of the invention comprises a pair of output transistors which are opposite in a conduction type to each other and connected in a complementary push-pull configuration, each of the output transistors having an emitter or output electrode connected to a reference potential point (For example, to the ground) through a load such as a speaker and a base connected to a common impedance for both of the output transistors and adapted to be supplied with an input signal. A first d.c. supply or power source is connected between the collector (or common electrode) of one of the paired output transistors and the reference potential point, while a second d.c. power source is connected between the collector (or common electrode) of the other one of the paired output transistors and the reference potential point. A third transistor is provided for a constant-current source circuit, which transistor is supplied with a constant voltage as the biasing voltage across the base and emitter thereof. A first resistor is connected between the emitter of the third transistor and the first d.c. supply source, which a second resistor is connected between the emitter of the third transistor and the second d.c. power source. The output current from the third transistor is supplied to the above-mentioned impedance element and the voltage thus appearing across the impedance element is applied to the paired output transistors as the bias voltages thereby to allow a constant d.c. collector currents to flow through the paired output transistors.

With above arrangement of the low-frequency power amplifier according to the invention in which the emitter of the third transistor serving as the constant-current source is connected to the first and second d.c. power sources through the first and the second resistors, respectively, variation in the bias voltage applied across the base and emitter of the third transistor as caused by variation in the source voltages of the first and second power sources can be compensated by a voltage supplied to the emitter of the third transistor from the first and second power sources through the first and second resistors in the direction to cancel out the above variation, whereby the voltage applied across the base-emitter junction of the third transistor can be maintained constant to suppress variation in the collector current thereof. In this manner, the paired output transistors connected for the push-pull operation is supplied with a constant bias voltage to maintain the d.c. collector currents thereof at a constant level. Further, when the voltage applied to the emitter of the third transistor through the first and second resistors is changed in accordance with change in the collector losses at the paired output transistors as caused by the variation in the source voltages, the bias voltage applied to the paired output transistors can be selectively adjusted in dependence on the collector losses, whereby the d.c. collector currents of the output transistors can be maintained constant.

Figure 2:
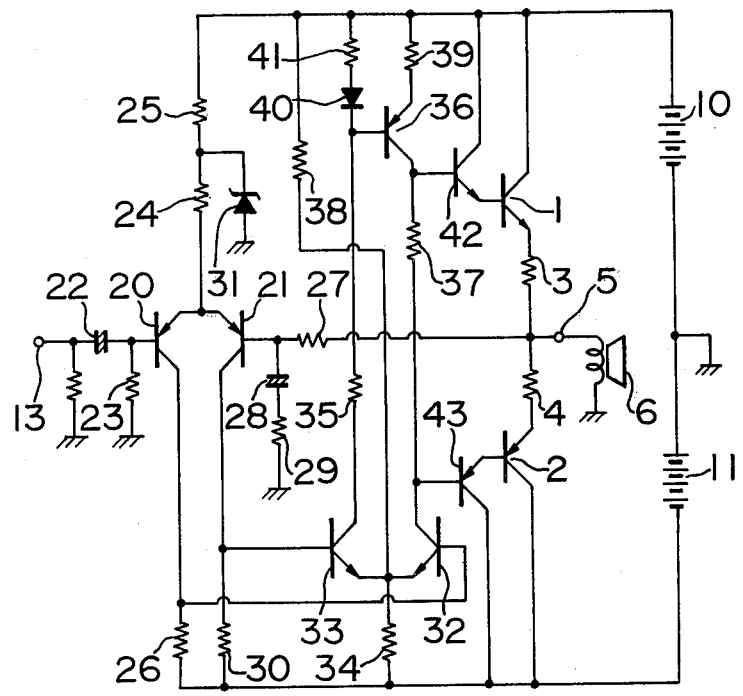
Figure 3:
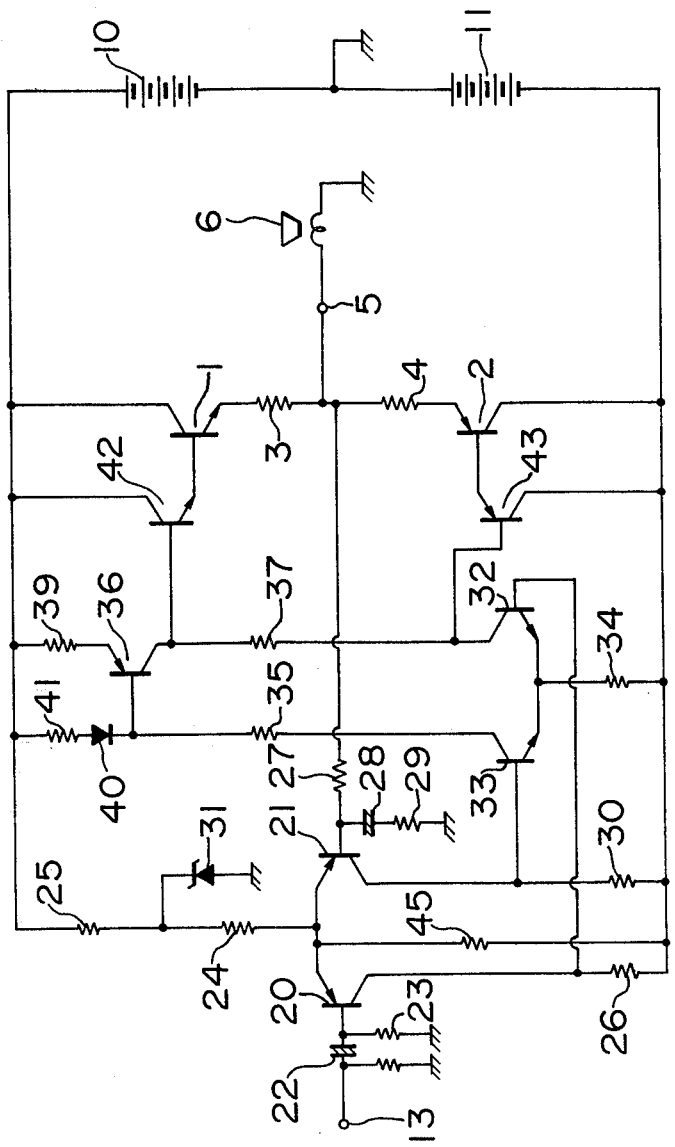

The above and other objects, features and advantages of the invention will become more apparent from the following detailed description of preferred embodiments of the invention. The description makes reference to the accompanying drawings, in which:

FIG. 1 is a circuit diagram showing a low-frequency power amplifier according to an embodiment of the invention, FIG. 2 is a circuit diagram showing a low-frequency power amplifier according to another embodiment of the invention, and FIG. 3 shows in a circuit diagram a further embodiment of the low- or audio-frequency power amplifier according to the teaching of the invention.

Now, the invention will be described to low- or audio-frequency power amplifiers with reference to the drawings. Referring at first to FIG. 1, a pair of output transistors 1 and 2 are opposite in a conduction type to each other, i.e. the transistor 1 is of NPN type, while the transistor 2 is of PNP type in the illustrated embodiment. The emitters of these transistors 1 and 2 are connected to a common output terminal 5 through resistors 3 and 4, respectively so that a single-ended push-pull amplifier is constituted which is adapted to effect the class B amplification. A load 6 is connected between the output terminal 5 and the ground. The load 6 is shown as a speaker in the illustrated embodiment. The base of the transistor 1 is directly connected to the collector electrode of a current-stabilizing transistor 7 constituting a constant-current circuit, while the base of the transistor 2 is connected directly to the collector electrode of a driver transistor 8. An impedance element 9 is connected between the bases of the paired transistors 1 and 2. In the described embodiment, the impedance element 9 is shown as constituted by a plurality of diodes connected in series to one another. The collector of the transistor 1 is connected to a positive or plus electrode of a first d.c. supply source 10. On the other hand, the collector of the transistor 2 is connected to a negative or minus electrode of a second d.c. supply source 11. The first and second d.c. sources 10 and 11 are connected in series to each other with the junction therebetween being grounded. The driver transistor 8 has a base connected to an input terminal 13 through a capacitor 12 and grounded through a resistor 14. The emitter of the driver transistor 8 is connected to the negative electrode of the second d.c. source 11 through a resistor 15. The current-stabilizing transistor 7 has a base connected to a cathod electrode of diodes 16 connected in series to one another and grounded through a resistor 17. The anode of the diode circuit 16 is connected to the positive electrode of the first d.c. power source 10. The emitter of the transistor 7 is connected to the positive electrode of the first d.c. power source 10 through a resistor 18 and additionally connected to the negative electrode of the second d.c. source 11 through a resistor 19.

In the circuit of the above arrangement, an input signal supplied to the input terminal 13 is amplified by the driver transistor 8 and fed to the paired output transistors 1 and 2 from the collector of the transistor 8. The transistors 1 and 2 will then amplify alternatively every half-cycle of the signal applied thereto. In more particular, the positive half-cycle of the input signal is amplified by the transistor 1, while every negative cycle of the input signal is amplified by the transistor 2, whereby the thus amplified signal output from the paired transistors 1 and 2 is fed to the load 6.

Since the transistors 1 and 2 are destined to perform the class B amplification with the operating points selected in the vicinity of linear portions of the respective characteristics curves, it is required to cause a constant collector current to flow through the transistors 1 and 2 even when no input signal is present, thereby to prevent the generation of the crossover distortion described hereinbefore. To this end, the arrangement is made such that a current flows through the series-connected diodes 16 by way of the resistor 17 in the forward direction, whereby a forward voltage drop is produced in the diode circuitry 16. The voltage thus appearing across the diode circuitry 16 is applied to the base-emitter junction of the current-stabilizing transistor 7 as a bias voltage, as a result of which a constant collector current will flow through the transistor 7, which collector current is then supplied to the diode circuitry 9 thereby producing a forward voltage drop. The voltage which thus appears across the diode circuitry 9 is applied to the bases of the paired output transistors 1 and 2 as the bias voltage, which results in constant d.c. current flows at the collectors of the respective transistors 1 and 2. In this manner, the transistors 1 and 2 are capable of amplifying the input signal at the linear portions of the respective characteristic curves without incurring any generation of the crossover distortion.

As described above, the diode circuitry 16 is biased in the forward direction by means of the d.c. source 10 to allow the forward current flow therethrough for the generation of the voltage drop in the forward direction. In this connection, it will be noted that, when the voltage of the d.c. source 10 varies, a slight variation will occur in the forward voltage drop in the diode circuitry 16. This variation in the voltage appearing across the diode circuitry 16 will of course make the collector current of the transistor 7 to vary correspondingly, which in turn brings about undesirably variations in the bias voltages applied to the transistors 1 and 2. It becomes thus necessary to prevent the collector currents of the transistors 1 and 2 from being varied, even when the voltage across the diode circuitry 16 undergoes variations.

With a view to evading the above difficulty, the circuit arrangement is made such that both the emitter current of the current stabilizer transistor 7 and the current flowing through the resistor 19 are caused to flow through the emitter resistance 18 of the transistor 7. The current flowing through this resistor 18 will vary in proportional dependence on variations in the voltages of the d.c. power sources 10 and 11. For example, when the voltages of the sources 10 and 11 increase, the current flowing through the resistors 18 and 19 will correspondingly increase, resulting in an increased voltage drop at the resistor 18. Further, the current flowing through the diode circuitry 16 and the resistor 17 will increase, as the voltage of the power source 10 increases. Consequently, the forward voltage drop at the diode circuitry 16 is also increased. However, since the rate of increase of the forward voltage drop at the diode circuitry 16 is smaller than that of the forward current flowing through the diode circuitry 16, the increase in the forward voltage drop at the diode circuitry 16 will remain at a small value. Thus, it is possible to make the increase of voltage drop at the resistor 18 to be greater than the increase in the forward voltage drop at the diode circuitry 16 or equal to the latter by appropriately adjusting the resistance value of the resistor 19. When the increase of voltage drop at the resistor 18 is made equal to the forward voltage drop at the diodes 16, the voltage applied across the base and emitter of the transistor 7 can be maintained constant, which results in that the current supplied to the diodes 9 is also maintained constant without undergoing any variations. On the other hand, when the increase of voltage drop at the resistor 18 is adjusted so as to be greater than the forward voltage drop at the diode circuitry 16, the voltage applied across the base and emitter of the transistor 7 is decreased to involve a correspondingly decreased collector current thereof which is supplied to the diode circuitry 9. In this manner, tendency of the collector currents of the transistors to increase as a result of a temperature rise at the respective junctions thereof which is caused by increased voltages of the power sources 10 and 11 can be effectively suppressed. In more particular, when the collector current of the transistor 7 decreases, the forward voltage drop at the diode circuitry 9 and hence the base biasing voltages applied to the transistors 1 and 2 are decreased, whereby increase in the collector currents thereof can be suppressed. Further, when the voltages of the power sources 10 and 11 are lowered for some reason, the current flowing through the resistors 18 and 19 is decreased to produce a correspondingly decreased voltage drop at the resistor 18, whereby decrease in the forward voltage drop at the diode circuitry 16 can be compensated.

It will thus be appreciated that, with the circuit arrangement shown in FIG. 1, the collector currents of the output transistors 1 and 2 can be maintained constant with the operating points of these transistors being positively protected from being drifted. Thus, any crossover distortion can be effectively reduced and consequently the transistors 1 and 2 are protected from any possible destructions.

FIG. 2 shows a low- or audio-frequency power amplifier according to another embodiment of the invention which is adapted to produce a large output signal. Referring to FIG. 2, a first transistor 20 for amplifying a small signal constitutes a first differential amplifier in cooperation with a negative feedback transistor 21. The base of the transistor 20 is connected to an input terminal 13 through a capacitor 22 and additionally grounded through a resistor 23. The emitter of the transistor 20 is connected to the emitter of a transistor 21 on one hand and connected to a positive electrode of a first d.c. power source 10 through two resistors 24 and 25 connected in series on the other hand. The transistor 20 has a collector connected to a negative electrode of a second d.c. power source 11 through a resistor 26 and connected additionally to the base of a second transistor 32 adapted for processing a small signal. The base of the transistor 21 is connected to an output terminal 5 through a negative feedback resistor 27 and also grounded through a capacitor 28 and a resistor 29. The collector of the transistor 21 is connected to a negative electrode of a signal d.c. power source 11 through a resistor 30 and at the same time to the base of a current control transistor 33. A Zener diode 31 is connected between the junction of two resistors 24 and 25 and the ground in the backward direction relative to the power source 10 so that the Zener voltage is applied across the bases and the emitters of the transistors 20 and 21 as the biasing voltage thereby to cause, these transistor to operate in a constant-current state. The transistors 32 and 33 have respective emitters coupled to each other which emitters are then connected to the negative electrode of the second power source 11 through a common resistor 34 so that a second differential amplifier is constituted by these transistors 32 and 33. The collector of the transistor 33 is connected to the base of a second current control transistor 36 through a resistor 35. On the other hand, the collector of the transistor 32 is connected to the collector of the transistor 36 through an impedance element 37, while the emitter thereof is connected to the positive electrode of the power source 10 through a resistor 38. The impedance element 37 corresponds to the element 9 in the amplifier shown in FIG. 1 and is illustrated as constituted by a resistor in FIG. 2. However, the impedance element 37 may be composed of a plurality of diodes connected in series. The emitter of the transistor 36 is connected to the positive pole of the power source 10 through a resistor 39, while the base thereof is connected to the cathode of a diode 40 which has the anode connected to the positive pole of the power source 10 through a resistor 41. A first driver transistor 42 has a base connected to the collector of the transistor 36 and an emitter connected to the base of a first output transistor 1. A second driver transistor 43 has a base connected to the collector of the transistor 32 and an emitter connected to the base of a second output transistor 2. The driver transistor 42 and the output transistor 1 on one hand and the driver transistor 43 and the output transistor 2 on the other hand constitute, respectively, Darlington circuits which are adapted to operate in the same manners as a single transistor of NPN or PNP type, respectively, so that a single-ended push-pull amplifier circuit is constituted.

In the amplifier circuit of the arrangement described above, the signal applied to the input terminal 13 is supplied to the small signal processing transistor 20 and thence supplied to the base of the second small signal amplifying transistor 32 from the collector of the transistor 20 after having been amplified. The amplified output signal from the transistor, which appears at the collector thereof, is supplied to the bases of the driver transistors 42 and 43. The negative feedback transistor 21 is supplied with a portion of the output signal from the output terminal 5 through the resistor with a view to improving the frequency characteristics of the amplifier and at the same time supplied with the input signal in the opposite phase relative to the input signal applied to the transistor 20. The amplified output signal from the collector of the transistor 21 is supplied to the base of the first current control transistor 33. Consequently, the transistors 32 and 33 are supplied with signals of the opposite phases relative to each other for amplification. The diode 40 exhibits the same characteristics as the base-emitter junction of the second current control transistor 36. The resistance values of the resistors 39 and 41 are selected at the same value so that the current of the magnitude equal to that of the current flowing through the diode 40 may flow through the collector of the transistor 36. When the transistor 36 is supplied with a positive signal at the base thereof and a negative signal is applied to the base of the transistor 32, the collector current of the transistor 33 will be increased while the collector current of the transistor 32 is decreased. The increased collector current of the transistor 33 gives rise to an increase in the current flowing through the diode 40 and the resistor 41, which in turn results in an increase in the voltage drop at the resistor 41 as well as in the forward voltage drop at the diode 40. Thus, the voltage applied across the base and emitter of the transistor 36 is increased as accompanied with a corresponding increase in the collector current of the transistor 36 which is supplied to the bases of the driver transistor 42 and output transistor 1. When negative and positive signals are applied to the bases of the transistors 33 and 32, respectively, the collector current of the transistor 33 will be decreased, while that of the transistor 32 increases. The decreased collector current of the transistor 33 is effective to decrease the voltage drops at the diode 40 and the resistor 41 and hence the collector current of the transistor 36. Accordingly, the increment of the collector current of the transistor 32 is compensated by the base currents of the driver transistor 43 and the output transistor 2. In this manner, the small signal amplifier transistor 32 as well as the current control transistor 33 operate in a push-pull mode to drive four transistors 1, 2, 42 and 43 at the output stage.

The transistors 20 and 21 which are supplied with the Zener voltage from the Zener diode 31 as the bias voltage will function as a constant-current source. Accordingly, a constant current will flow through the collectors of these transistors, resulting in a constant voltage at the respective collectors thereof. The collector voltages are applied across the base-emitter junctions of the transistors 32 and 33, respectively, as the bias voltage. Thus, the transistors 32 and 33 will function also as a constant-current source. Accordingly, a constant current will flow through the collector of the transistor 32 even when no signal is present, producing a constant voltage drop at the resistor 37 which is applied to the four transistors 1, 2, 42 and 43 as the bias voltage. In this manner, the d.c. current at the collectors of these transistors 1, 2, 42 and 43 is maintained constant thereby to prevent the crossover distortions which would otherwise occur. Upon variation in the voltages of the power sources 10 and 11, the Zener voltage of the Zener diode 31 will undergo a corresponding small variation. Under such circumstances, the collector currents of the transistors 20 and 21 will vary, resulting in variation in the bias voltages applied to the transistors 32 and 33. However, the variation in the bias voltages is compensated by the variation in the current flowing through the resistor 38 connected between the emitters of these transistors 32 and 33 and the power source 10. In other words, the current flowing through the resistor 34 corresponds to a sum of the currents flowing through the transistors 32 and 33 and the current flowing through the resistor 38 which varies in proportion to the variation in the voltages of the power sources 10 and 11. Accordingly, it is possible to make the variation in the voltage drop at the resistor 34 to be equal to variations in the collector voltages of the transistors 20 and 21 by adjusting appropriately the resistance value of the resistor 38. Thus, the collector current of the transistor 32 can be maintained constant. In this way, the d.c. collector current of the transistors 1 and 2 can be held at a constant level by decreasing the collector current of the transistor 32 in consideration of increase in the collector losses of the transistors 1 and 2, if necessary.

FIG. 3 shows another embodiment of the low-frequency power amplifier according to the invention which operates in a similar manner as the amplifier circuit shown in FIG. 2 for the amplification of audio signal. Referring to FIG. 3, a resistor 45 is connected between the coupled emitters of the first small signal amplifier transistor 20 and the negative feedback transistor 21 and the negative electrode of the second d.c. power source 11. A current corresponding to a sum of the currents flowing through the transistors 20 and 21 and the resistor 45 will flow through the resistor 24. Variation in the voltage drop at the resistor 24 may be made to coincide with variation in the Zener voltage of the Zener diode 31 by adjusting correspondingly the resistance value of the resistor 45. Thus, the bias voltage applied to the transistors 32 and 33 can be maintained constant with the voltage drop at the resistor held at a constant level, since the collector voltages of the transistors 32 and 33 can be prevented from variation in the above described manner.

As will be appreciated from the foregoing description, the low- or audio-frequency power amplifier constructed according to the teaching of the invention allows the d.c. collector current components of the output transistors to be maintained constant independently from variation in the d.c. source voltage and is very effective for reducing generation of the crossover distortions. The amplifier according to the invention is therefore suited to be used as a power amplifier capable of producing a high output with a d.c. power source susceptible to large variations in the source voltage.

We claim:
1. A low-frequency power amplifier comprising:
first and second transistors which are opposite in a conduction type to each other, each having an input electrode,
an output electrode and a common electrode,
a load connected between said output electrodes of said first and second transistors and a reference potential point,
a first d.c. supply source connected between said common electrode of said first transistor and said reference potential point,
a second d.c. supply source connected between the common electrode of said second transistor and said reference potential point,
means for supplying an input signal to said first and second transistors at the respective input electrodes,
an impedance element connected between the input electrodes of said first and second transistors,
a third transistor having an input electrode, an output electrode and a common electrode,
means for supplying a bias voltage between the input and the common electrodes of said third transistor,
means for supplying an output current from said third transistor to said impedance element,
a first resistor means connected between the common electrode of said third transistor and said first d.c. supply source, and
a second resistor means connected between the common electrode of said third transistor and said second d.c. supply source.
2. A low-frequency power amplifier comprising:

a pair of output transistors which are opposite in a conduction type to each other and each having an input electrode, an output electrode and a common electrode, a load connected between said output electrodes of said paired output transistors and a reference potential point, a first d.c. supply source connected between the common electrode of one of said paired output transistors and said reference potential point, a second d.c. supply source connected between the common electrode of the other of said paired output transistors and said reference potential point, means for supplying an input signal to each of the input electrodes of said paired output transistors, an impedance element connected between the input electrodes of said paired output transistors, a current stabilizer transistor having an input electrode, an output electrode and a common electrode, means for applying a bias voltage across the input and the common electrode of said current stabilizer transistor, means for supplying an output current from said current stabilizer transistor to said impedance element, a first resistor connected between the common electrode of said current stabilizer transistor and said first d.c. supply source, and a second resistor connected between the common electrode of said current stabilizer transistor and said second d.c. supply source.

3. A low-frequency power amplifier as set forth in claim 2, wherein said impedance element comprises a plurality of diodes connected in series to one another.

4. A low-frequency power amplifier as set forth in claim 2, wherein voltage drop produced across a diode or diodes in the forward direction thereof is applied across the input and the common electrodes of said current stabilizer transistor.

5. A low-frequency power amplifier as set forth in claim 2, wherein a Zener voltage of a Zener diode is applied across the input and the common electrodes of said current stabilizer transistor.

6. A low-frequency power amplifier comprising:
a pair of output transistors which are opposite in a conduction type to each other, each having a base electrode, an emitter electrode and a collector electrode, a load connected between the emitter electrodes of said paired output transistors and a reference potential point, a first d.c. supply source connected between the collector electrode of one of said paired output transistors and said reference potential point, a second d.c. supply source connected between the collector electrode of the other of said paired output transistors and said reference potential point, an impedance element connected between the base electrodes of said paired output transistors, means for supplying a signal to each of said base electrodes of said paired output transistors, a current stabilizer transistor having a base electrode, an emitter electrode and a collector electrode, means for supplying the collector current of said current stabilizer transistor to said impedance element, means for supplying a bias voltage across the base and the emitter electrode of said current stabilizer transistor, a first resistor connected between the emitter electrode of said current stabilizer transistor and said first d.c. supply source, and a second resistor connected between the emitter electrode of said current stabilizer transistor and said second d.c. supply source.

7. A low-frequency power amplifier comprising:
a first transistor having a base electrode adapted to be supplied with a signal, an emitter electrode and a collector electrode which is adapted for producing an output signal, a second transistor having a base electrode which is d.c. coupled to the collector electrode of said first transistor, an emitter electrode and a collector electrode adapted for producing an output signal, third and fourth transistors which are opposite in a conduction type to each other, each having a base electrode, an emitter electrode adapted to produce an output signal and a collector electrode, an impedance element connected between the base electrodes of said third and fourth transistors, means for d.c. coupling the base electrode of said third transistor and the collector electrode of said second transistor to each other, a d.c. supply source connected between the collector electrodes of said third and fourth transistors and having a mid-point connected to a reference potential point, a first resistor connected between the emitter electrode of said first transistor and one pole of said d.c. supply source, second and third resistors connected in series to each other, means for d.c. coupling said second and third resistors between the emitter electrode of said first transistor and the other pole of said d.c. supply source, and a Zener diode connected between the junction of said second and third resistors and said reference potential point.

8. A low-frequency power amplifier comprising:
a first transistor having a base electrode adapted to be supplied with a signal, an emitter electrode and a collector electrode which is adapted for producing an output signal, a second transistor having a base electrode which is d.c. coupled to the collector electrode of said first transistor, an emitter electrode and a collector electrode adapted for producing an output signal, third and fourth transistors which are opposite in a conduction type to each other, each having a base electrode, an emitter electrode adapted for producing an output signal and a collector electrode, an impedance element connected between the base electrodes of said third and fourth transistors, means for d.c. coupling the collector electrode of said second transistor to the base electrode of said third transistor, a d.c. supply source connected between the collector electrodes of said third and fourth transistors and having a mid-point connected to a reference potential point, means for supplying a bias voltage across the base and emitter electrodes of said first transistor, a first resistor connected between the emitter electrode of said second transistor and one pole of said d.c. supply source, and a second resistor connected between the emitter electrode of said second transistor and the other pole of said d.c. supply source.

* * * * *